United States Patent
Svärd (10) Patent No.: US 6,677,789 B1
(45) Date of Patent: Jan. 13, 2004

(54) RAIL-TO-RAIL LINEAR CHARGE PUMP

(75) Inventor: Mikael Svärd, Borgå (FI)

(73) Assignee: Nokia Corporation, Espoo (NL)

( * ) Notice: Subject to any disclaimer, the term of this patent is extended or adjusted under 35 U.S.C. 154(b) by 0 days.

(21) Appl. No.: 10/241,824

(22) Filed: Sep. 10, 2002

(51) Int. Cl.⁷ .................................. H03L 7/06

(52) U.S. Cl. ........................ 327/157; 327/148

(58) Field of Search ................. 327/148, 157, 327/306, 536, 537, 535

(56) References Cited

U.S. PATENT DOCUMENTS

| | | | | |
|---|---|---|---|---|
| 5,508,660 A | * | 4/1996 | Gersbach et al. ............. | 331/17 |
| 5,751,194 A | | 5/1998 | Haapanen et al. ............ | 331/17 |
| 5,783,971 A | | 7/1998 | Dekker ........................ | 331/17 |
| 5,959,478 A | | 9/1999 | Ciccone et al. ............. | 327/157 |
| 6,107,889 A | * | 8/2000 | Strange et al. ............... | 331/17 |
| 6,526,111 B1 | * | 2/2003 | Prasad ........................ | 375/376 |

OTHER PUBLICATIONS

US203/0048126A1, "Charge pump current compensating circuit" by Watarai, Mar. 2003.*

* cited by examiner

Primary Examiner—Tuan T. Lam
(74) Attorney, Agent, or Firm—Ware, Fressola, Van Der Sluys & Adolphson LLP (57) ABSTRACT

A rail-to-rail linear current mode charge pump is disclosed, wherein current is sourced to an output voltage load through a current mirroring source device when a first switching device operates. Current is sunk from the output voltage node through a current mirroring sink device when a second switching device operates. An internally generated voltage mirrors the voltage at the output node by means of a rail-to-rail feedback network which operates in such a manner that an input source current IREF splits in such a way that the current pulses sourced to or sunk from the output voltage node are reflected to a first current source device and a first current sink device in series forming a node therebetween representative of the internal voltage node. The internal voltage node reaches steady state when the current flowing through the first current source device and first current sink device, whereby the charging or discharging of the voltage at the output voltage node is a function of the timing of the first switching device and second switching device.

8 Claims, 5 Drawing Sheets

RAIL-TO-RAIL LINEAR CHARGE PUMP

TECHNICAL FIELD

The present invention relates generally to charge pumps used in phase/delay-locked loops and deals more particularly with a charge pump having a linear time to charge transformation across the rail-to-rail voltage range.

BACKGROUND OF THE INVENTION

Digital frequency synthesizers have long been used in communication systems, particularly RF communications systems, to generate RF signals carried over RF channels. In frequency synthesis, it is desirable to achieve the selected frequency output with low phase noise in as little time as possible with any spurious output frequencies minimized. It is known to create a frequency synthesizer by placing a frequency divider function between the voltage-controlled oscillator (VCO) output and the phase frequency detector (PFD) in a phase-locked loop (PLL), wherein the VCO output frequency is an integer multiple of the input reference frequency to the PFD. The spurious outputs in question are usually associated with the charge pump in the PFD and occur at the phase detector operating frequency, which is generally the same as channel spacing. Incorporating the fractional-N division function in the PLL allows the phase detector to operate at a much higher frequency for the same channel spacing and have better phase noise, however, the fractional-N division function also introduces fractional spurs at the fractional offset and fractions of the comparison frequency.

Figure 1:
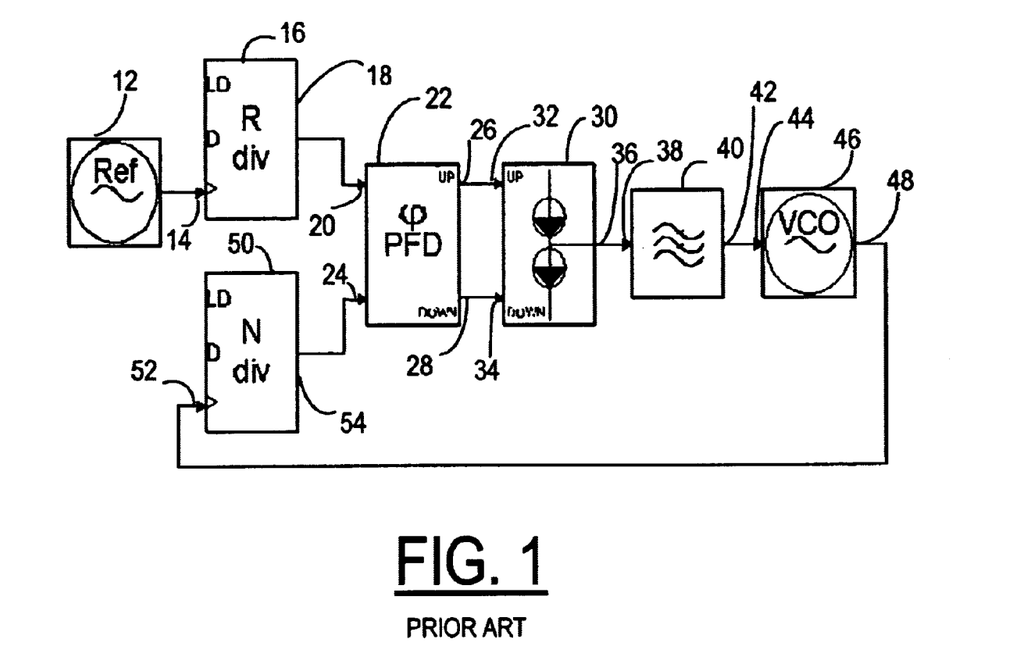
FIG. 1 is a functional block diagram of a phase-locked loop voltage-controlled oscillator of the general type showing a charge pump responsive to a phase frequency detector to drive the loop filter to adjust the loop frequency to the desired frequency.

A functional block diagram of a representative phase-locked loop frequency synthesizer having a frequency divider function in the feedback loop between the VCO output and the phase detector is illustrated in FIG. 1 and generally designated 10. The phase-locked loop frequency synthesizer 10 is a general class known as Integer-N phase-locked loop frequency synthesizers. A reference frequency ($F_{IN}$) from a frequency generator source 12 is applied to the input 14 of a frequency reference divider 16. The reference divider 16 generates the desired reference frequency $F_{REF}$ at its output 18, which is coupled to one input 20 of a phase frequency detector (PFD) 22. A divide-by-N counter 50 located in the feedback path between the VCO output 48 and an input 24 of the PFD 22 provides the desired fractional division function. The PFD 22 has an UP output 26 and a DOWN output 22 coupled to the UP input 32 and DOWN input 34, respectively, of the charge pump 30 which is shown separately from the PFD 22 for purposes of clarity and to give a better understanding of the invention. The charge pump 30 responds to the UP or DOWN input signal from the PFD 22 to supply or sink current at its output 36, which output 36 is coupled to the input 38 of the loop filter 40. The output 42 of the loop filter 40 is coupled to the input 44 of the VCO 46 to provide control to the VCO to cause it to generate the desired output frequency $F_{OUT}$ at its output 48. The signal $F_{COMP}$ at the output 54 of the divide-by-N counter 50 is coupled to the input 24 of the PFD 22 and is representative of the loop phase error, that is, the difference in phase between the frequency $F_{OUT}$ at the VCO output 48 and the input frequency $F_{REF}$ at the input 20 to the PFD 22. The operation of Integer-N phase locked loops of the general type described above wherein a charge pump sources or sinks current to or from the loop filter is well known to those skilled in the art. It will also be understood by those skilled in the art that a charge pump sources or sinks current to or from the loop filter in a similar manner in fractional-N phase locked loops. The reader 20 is referred to textbooks and readily available commercial literature to gain a fuller understanding of the operation of such PLLs.

Figure 2:
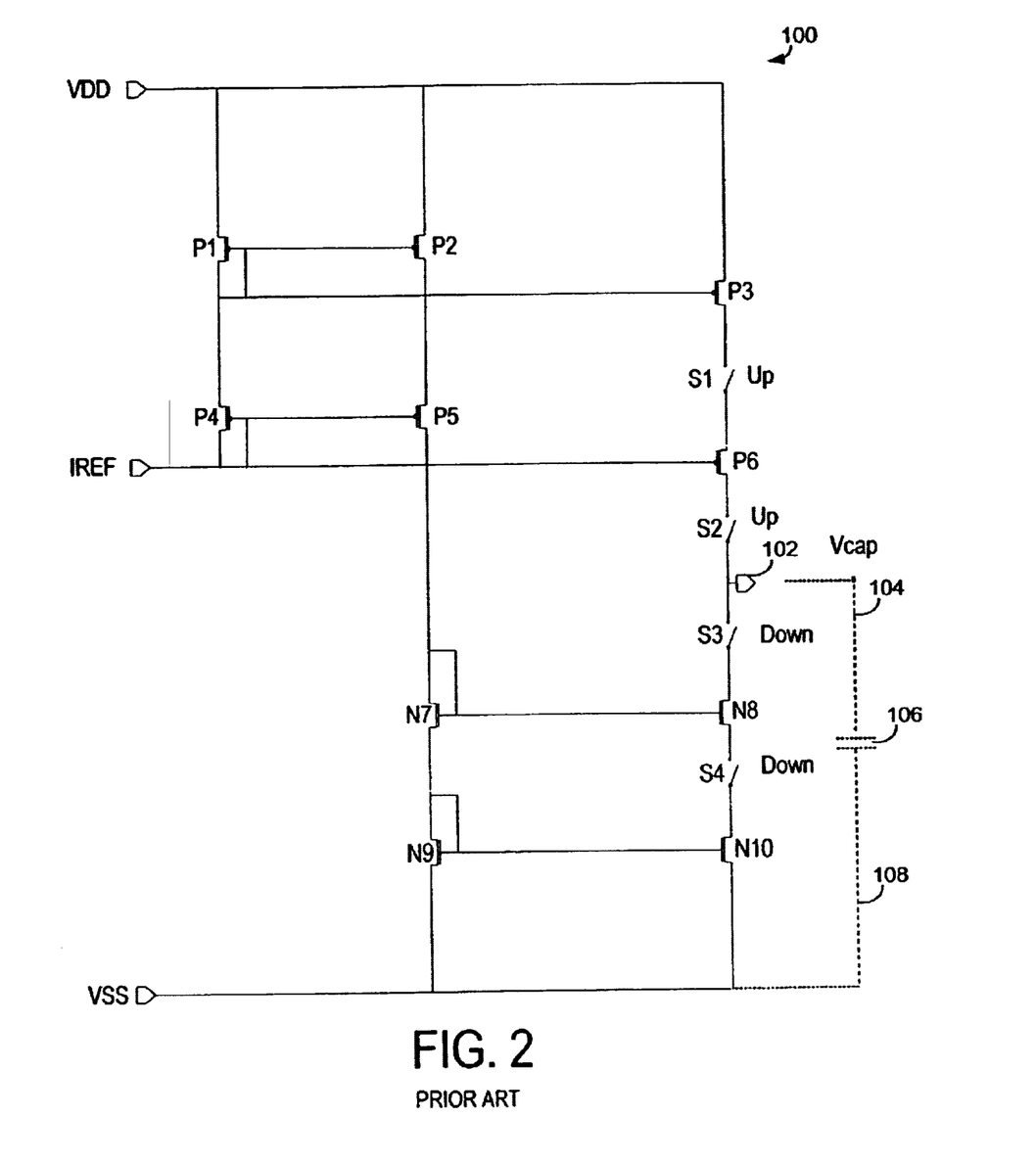
FIG. 2 is an electrical circuit schematic diagram of a prior art charge pump.

As frequency synthesizers operate at increasingly faster or higher speeds due to the continuous advances made in semiconductor processes, which processes have provided for improved component matching and performance, there has been a need to improve the performance and linearity of charge pumps used to drive the loop filter in a phase-locked loop. One approach to improve performance has been to use a cascoded current mirror as illustrated in FIG. 2 to achieve matching at the output. By definition a linear timing error-to-voltage correction will be needed when the reference frequency $F_{REF}$ is compared to the divided VCO frequency $F_{COMP}$. A linear timing error-to-voltage correction is achieved by ensuring that for all voltages there is a constant current flowing into a known capacitance as in the case of the loop filter in the phase-locked loop. As semiconductor fabrication techniques improve to operate with lower voltage power sources, it is necessary to provide more output current for a given die size and to maintain precise regulation of the current. A typical prior art rail-to-rail charge pump is represented by the electrical circuit schematic diagram shown in FIG. 2 and is generally designated 100. The charge pump 100 includes cascoded current mirrors in an attempt to achieve matching for linear operation. In the rail-to-rail cascoded current mirrors circuit shown in FIG. 2, the sink and mirroring devices must be very closely matched for balancing. When switches S1 and S2 operate due to the PFD generating an UP signal, current flows from rail VDD through P1 and P4 and is mirrored in P3 and P6, respectively. Current through P3 and P6 is delivered to the $V_{CAP}$ NODE at the charge pump output 102 to charge or source current to the end 104 of the loop filter capacitor generally designated 106, that is, increase the voltage across the loop filter capacitor. The end 108 of the loop filter capacitor 106 opposite the $V_{CAP}$ NODE output 102 is connected to the rail VSS.

When switches S3 and S4 operate due to the PFD generating a DOWN signal, current flowing through N7 and N9 is mirrored in N8 and N10, respectively, to sink current from the $V_{CAP}$ NODE at the charge pump output 102 to discharge the loop filter capacitor 106, that is, to lower the voltage across the loop filter capacitor. When switches S3 and S4 are operated, switches S1 and S2 are open, and the current flowing through P1 and P4 is mirrored in P2 and P5, respectively. The current through P2 and P5 flows through N7 and N9 to the rail VSS.

$I_{REF}$ is a current source. If the sink and mirroring devices are not precisely matched, the current supplied to and sunk from the $V_{CAP}$ NODE at the charge pump output 102 will not have a linear response, that is, the loop filter capacitor 106 may charge and discharge at different rates from the same number of UP signal and DOWN signal pulses from the PFD. This causes the voltage at the $V_{CAP}$ NODE to vary over time during the charging and discharging of the loop capacitor, which results in reference spurs for integer PLLs and fractional and offset spurs for fractional PLLs and a nonlinear time-to-charge transformation.

The prior art cascoded current mirror charge pump of FIG. 2 also has limitations on the switching speed of switches S1, S2 and S3, S4 due to the characteristics of transistor devices P3, P6 and N8, N10. The transistors P3, P6 and N8, N10 are of relatively large size in the range of L=1 $\mu$m and W=1000 $\mu$m which causes the devices to act or function as large capacitors. Any differences in switching times between switches S1, S2 or S3, S4 cause the transistor device to discharge during the switching time interval difference, that is, one transistor is switched fully ON or OFF before the other transistor is switched fully ON or OFF. It is this discharge caused by the switching time difference that controls the maximum switching frequency of the switches. The cascoded transistors and additional transistor switch limit the range of the voltage on $V_{CAP}$ NODE at the charge pump output 102 due to the voltage drops across the devices.

Accordingly, it is an object of the present invention to provide a linear rail-to-rail charge pump that overcomes the disadvantages of prior art rail-to-rail charge pumps.

It is a further object of the present invention to provide a linear rail-to-rail charge pump that compensates for any differences in switching times between the UP and DOWN switching transistors.

It is a yet further object of the present invention to provide a linear rail-to-rail charge pump that uses a feedback circuit to insure a linear time to charge transfer characteristic at the charge pump output.

It is a still further object of the present invention to provide a linear rail-to-rail charge pump for use in a phase locked loop that substantially eliminates non-linearities that cause the VCO frequency output to have less than a linear frequency response.

SUMMARY OF THE INVENTION

In accordance with the invention, a charge pump having a linear time to charge transformation across the rail-to-rail voltage range is presented.

The rail-to-rail linear current mode charge pump circuit has an input source current $I_{REF}$ and operates between a first voltage rail VDD and a second voltage rail VSS. A first current source device is coupled to the first voltage rail VDD and is connected to a first current mirroring source device for mirroring the current through the first current source device. A first current sink device is coupled to the second voltage rail VSS and also to a first current mirroring sink device for mirroring the current through the first current sink device. The first current source device and the first current sink device are also coupled in electrical series and form a voltage node $V_{COMP}$ therebetween. A first switching device having ON and OFF states and responsive to a first control signal switches between its ON and OFF states to cause the first current mirroring source device to source current to an output voltage node. A second switching device having ON and OFF states and responsive to a second control signal switches between its ON and OFF states to cause the first current mirroring sink device to sink current from the output voltage node.

A rail-to-rail feedback network is coupled between the first current source device and the first current sink device and an $I_{REF}$ current splitting circuit. The current splits in such a way that the current sourced to or sunk from the output voltage node is copied to the voltage node $V_{COMP}$. The voltage at the voltage node $V_{COMP}$ reaches a steady state condition when the current flowing through the first current source and the first current sink devices is equal, whereby the charging or discharging of the voltage at the output voltage node is a function of the timing of the first switching device and second switching device.

Preferably, the first current source device has matching operational characteristics with the first current mirroring source device, and the first current sink device has matching operational characteristics with the first current mirroring sink device.

Preferably, the voltage at the output voltage node has a linear transfer characteristic over the voltage range between VDD-VSS.

Preferably, the UP control signal and the DOWN control signal are generated by a phase frequency detector.

Preferably, the first switching device is coupled in series with the first current mirroring source device and the output voltage node, and the second switching device is coupled in series with the first current mirroring sink device and the output voltage node.

In a further aspect of the invention, a method for providing a linear time-to-charge transformation in a rail-to-rail current mode charge pump is presented. The method includes the steps of:

providing an input source current $I_{REF}$;

providing a first voltage rail VDD;

providing a second voltage rail VSS;

coupling a first current source device to the first voltage rail VDD;

mirroring the current through the first current source device in a first current mirroring source device;

sourcing current from the first current mirroring source device to an output voltage node in response to a first control signal;

coupling a first current sink device to the second voltage rail VSS;

mirroring the current through the first current sink device in a first current mirroring sink device;

sinking current from the first current mirroring sink device and from the output voltage node in response to a second control signal;

coupling the first current source device and the first current sink device in electrical series and forming a voltage node $V_{COMP}$ therebetween;

coupling a rail-to-rail feedback network between the first current source device and the first current sink device for splitting the current $I_{REF}$ such that the current sourced to or sunk from the output voltage node is copied to the voltage node $V_{COMP}$ to cause the voltage at the voltage node $V_{COMP}$ to reach a steady state condition when the current flowing through the first current source and the first current sink devices is equal, whereby the charging or discharging of the voltage at the output voltage node is a function of the timing of the first switching and second switching control signals.

BRIEF DESCRIPTION OF THE DRAWINGS

Other features, objects and benefits of the present invention will become readily apparent from the following written description taken in conjunction with the drawings, wherein.

DETAILED DESCRIPTION

Figure 3:
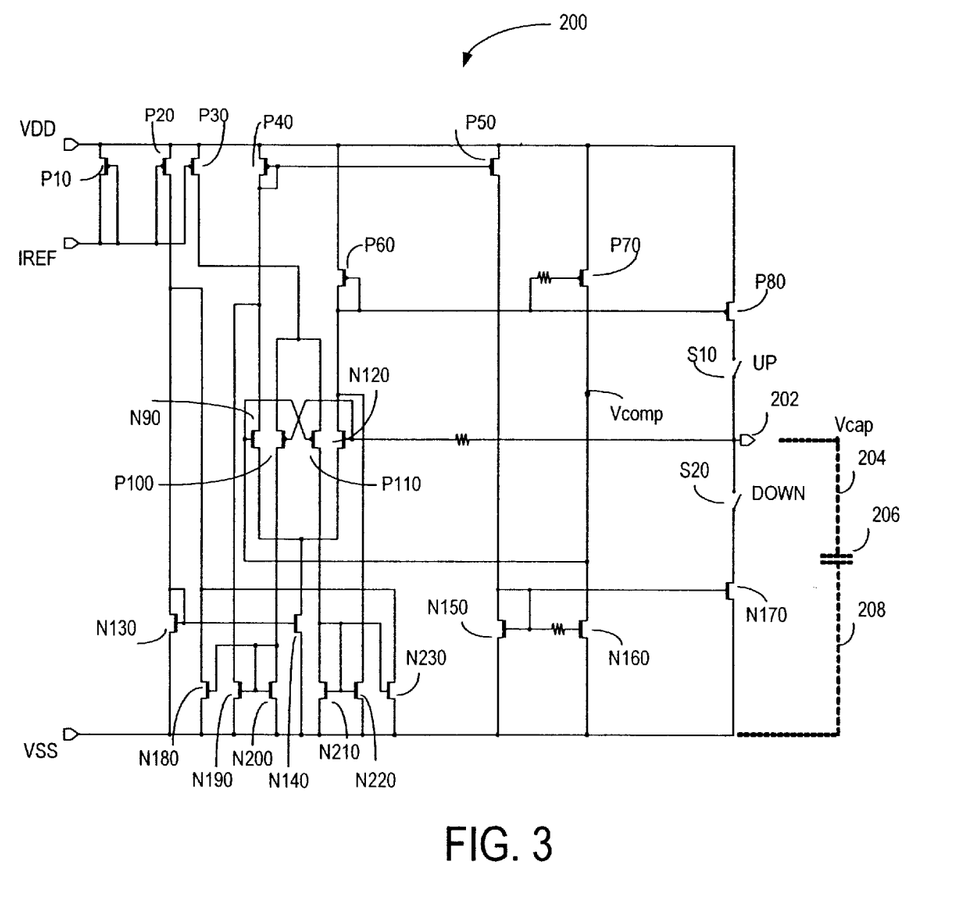
FIG. 3 is an electrical circuit schematic diagram of a rail-to-rail current mode charge pump embodying the present invention.

Turning now to the drawings and considering the invention in further detail, a first illustrative embodiment of the rail-to-rail linear current mode charge pump embodying the present invention is illustrated in FIG. 3 as an electrical circuit schematic diagram, generally designated 200. The charge pump 200 includes a rail-to-rail feedback network which eases the operational demand on the current mirroring source device P80 and the current mirroring sink device N170 in the charge pump output as described in further detail below. In FIG. 1, a switch S10 operates in response to a first control signal and the switch S20 operates in response to a second control signal. In a phase-locked loop for example, the phase frequency detector (PFD) could generate the first control signal as an UP signal to source current to a loop filter capacitor, generally designated 206, having one end 204 coupled to the output 202 of the rail-to-rail linear charge pump 200. The end 208 of the loop filter capacitor 206 is coupled to the VSS rail. When the switch S20 operates in response to the second control signal for example, due to the PFD generating a DOWN signal, current flows through N170 to sink current from the $V_{CAP}$ NODE at the output 202 to discharge the loop filter capacitor 206. The rail-to-rail feedback network is made up of devices P20, P30, P40, P50, P60, P70, P100, P110, N120, N140, N150, N160, N180, N190, N200, N210, N220 and N230 electrically coupled and connected as shown in the electrical circuit schematic illustrated in FIG. 3. The feedback network forces the ON currents flowing through P80 when switch S10 is operated and through N170 when switch S20 is operated to be substantially identical for all $V_{CAP}$ NODE voltages at the output 202 for all voltages within the rail-to-rail voltage range VSS-VDD.

The rail-to-rail feedback network operates such that a reference current $I_{REF}$ from a current source is split between devices P40 and P60 in such a way that the voltage $V_{COMP}$ measured at the node between devices P70 and N160 is equal to the voltage on the $V_{CAP}$ NODE at the output 202. The voltage $V_{COMP}$ will equal the voltage on the $V_{CAP}$ NODE when the current through device P70 and through device N160 is equal. When the current through device P80 is a multiple of the current through the device P70 and when the current through device N170 is a multiple of the current through the device N160, a current match occurs with the current at the output 202 for all loop capacitor filter loading voltages. Maintaining the currents flowing through the devices P80 and N170 to be substantially identical for all $V_{CAP}$ voltages within the rail-to-rail voltage values VSS-VDD is obtained by active tracking of the voltage at the output 202 and the changing of the mirroring currents in devices P40 and P60. The current flowing through the device P80 is not continuous as it is controlled by the PFD UP pulses which turns the UP switch S10 ON and OFF. This provides a continuous representation of the pulsed current by copying the voltage with the rail-to-rail amplifier to the internal continuous voltage $V_{COMP}$ at the node between devices P70 and N160. When the system is operational, the voltage stored in the loop filter capacitor 206 is only charged or discharged by current pulses through device P80 when the UP switch S10 is active or current pulses through the device N170 when the DOWN switch S20 is active and is copied to the voltage at the NODE $V_{COMP}$. The DC voltage measured at the NODE $V_{COMP}$ will be stable when the current pulses flowing through the devices P70 and N160 are equal. By necessity, this means that when the UP and DOWN switches S10 and S20, respectively, are turned on and off by the PFD UP and PFD DOWN pulses, equal DC currents flow through the devices P80 and N170. The charging of the $V_{CAP}$ NODE voltage at the output 202 is then only a function of timing on the UP switch S10 and DOWN switch S20. The timing of the UP and DOWN switches provides a linear time to charge transformation at the output. The rail-to-rail linear current mode charge pump of the present invention provides less voltage drop at the output compared to the voltage drop across the cascoded transistors and series switching transistors as taught in the prior art. In addition, it is possible for the PFD to pulse the UP switch S10 and DOWN switch S20 at a much higher switching speed than that of the cascaded current mirror structures of the prior art because only one switch is used in the UP or DOWN legs of the circuit, and therefore the time differences in TURN ON and TURN OFF with multiple switches is not present. The single transistor device in the UP and DOWN current legs reduces the parasitic load on the output 202, which also contributes to increased switching speed. The rail-to-rail linear current mode charge pump of the present invention minimizes the number of devices that require matching to achieve a linear operation and only requires that devices P70 and P80 be matched and devices N160 and N170 be matched.

The current output is a function of and defined by the relationship shown in equation 1, wherein the matching of the devices is dependent only upon the length (L) of the device, therefore allowing smaller devices to be used.

$$\Delta i = \frac{V_{DSZ} - V_{DSI}}{V_{E_n} L_Z} \qquad \text{Eq. 1}$$

Figure 4:
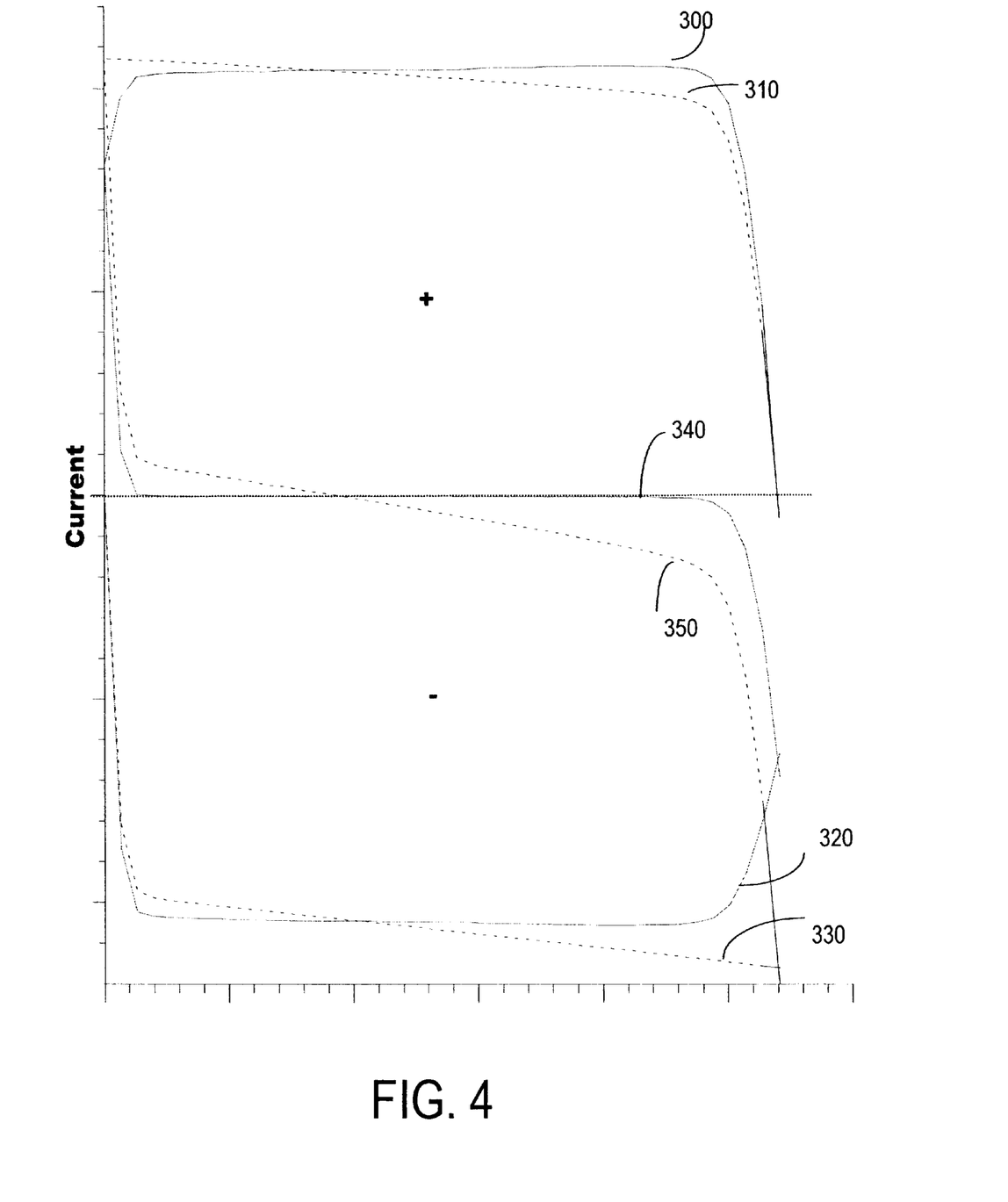
FIG. 4 shows a number of waveform representations of the UP and DOWN current outputs with and without feedback to demonstrate the linearity achieved with the rail-to-rail current mode charge pump of the present invention.

FIG. 4 shows a number of waveform representations of the UP and DOWN current outputs with and without feedback. As shown in FIG. 4, the UP current charge characteristic curve 300 with feedback is substantially linear across the entire output range in contrast to the UP current transfer characteristic curve 310 without feedback which starts out at a higher current level dropping to a lower current level and crossing the UP current curve 300 at approximately midway across the range. Likewise, it can be seen that the DOWN current curve 320 with feedback as provided by the present invention is substantially linear across its entire range. In contrast, the DOWN current transfer curve 330 without feedback starts out at a higher current level dropping to a lower current level and crossing the DOWN current curve 320 at approximately midway across its range. Likewise, the current matching characteristic with feedback as illustrated by the transfer curve 340 is substantially linear across its entire range, which is in contrast to the current matching transfer curve without feedback 350, which starts out at a positive level, crossing zero and ending at a negative level at the end of its range. The rail-to-rail current mode charge pump embodying the present invention exhibits an extremely high linearity, which permits higher PFD switching speeds, which allows the phase locked loop with which the charge pump is used to achieve the desired channel frequency lock in a relatively shorter time period.

Figure 5:
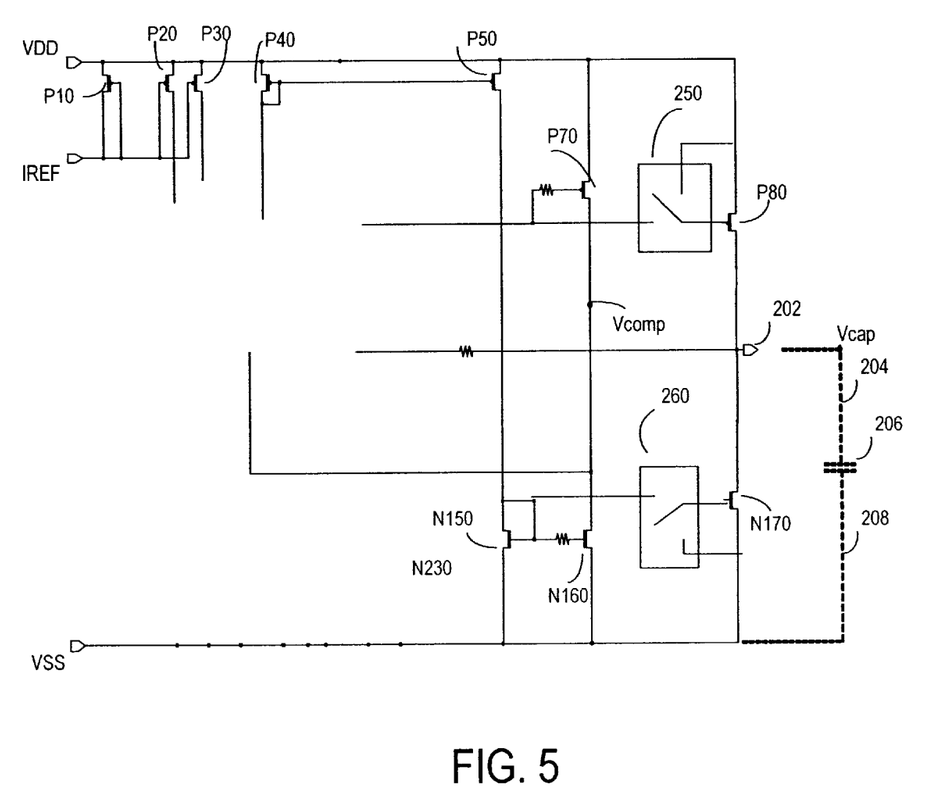
FIG. 5 is a partial electrical circuit schematic diagram showing an alternate embodiment for controlling the current mirroring source and sink devices using voltage switches in the gate circuits of the devices.

FIG. 5 is a partial circuit schematic diagram which illustrates an alternate embodiment for controlling the current mirroring source and sink devices. In the embodiment of FIG. 5, the current mirroring source device P80 and current mirroring sink device N170 are coupled directly to the $V_{CAP}$ NODE at the output 202. A voltage switch generally designated 250 is coupled between the gate (G) terminal of the current mirroring source device P80 and the source switching device P70. When the voltage switch 250 operates to complete the electrical path to the source device P70, the current mirroring source device P80 conducts. When the voltage switch 250 operates to couple the gate (G) terminal to the drain (D) terminal, no current flows through the current mirroring source device P80. The current mirroring sink device N170 also has its gate (G) terminal connected in a similar manner to a voltage switch 260 and is controlled in a similar manner.

A rail-to-rail linear current mode charge pump having a feedback network forcing the source and sink currents to be substantially identical for all voltages on the loop filter capacitor within the rail-to-rail voltage range VSS-VDD has been described above in a preferred embodiment. Numerous changes may be made to the invention by those skilled in the art, for example by changing the current multiple through the charge pump current source and current sink output devices. Therefore, the invention has been described by way of illustration rather than limitation.

What is claimed is:

1. A rail-to-rail linear current mode charge pump comprising:
   an input source current $I_{REF}$;
   a first voltage rail VDD;
   a second voltage rail VSS;
   a first current source device coupled to said first voltage rail VDD;
   a first current mirroring source device for mirroring the current through said first current source device;
   a first switching device having ON and OFF states and responsive to a first control signal for switching between its ON and OFF states to cause said first current mirroring source device to source current to an output voltage node;
   a first current sink device coupled to said second voltage rail VSS;
   a first current mirroring sink device for mirroring the current through said first current sink device;
   a second switching device having ON and OFF states and responsive to a second control signal for switching between its ON and OFF states to cause said first current mirroring sink device to sink current from said output voltage node;
   said first current source device and said first current sink device being coupled in electrical series and forming a voltage node $V_{COMP}$ therebetween;
   a rail-to-rail feedback network coupled between said first current source device and said first current sink device and an $I_{REF}$ current splitting circuit such that the current sourced to or sunk from the output voltage node is copied to the voltage node $V_{COMP}$, said voltage at the voltage node $V_{COMP}$ reaching a steady state condition when the current flowing through said first current source and said first current sink devices is equal, whereby the charging or discharging of the voltage at the output voltage node is a function of the timing of the first switching device and the second switching device.

2. The rail-to-rail linear current mode charge pump as defined in claim 1, further comprising said first current source device having matching operational characteristics with said first current mirroring source device, and said first current sink device having matching operational characteristics with said first current mirroring sink device.

3. The rail-to-rail linear current mode charge pump as defined in claim 1, further comprising said voltage at the output voltage node having a linear transfer characteristic over the voltage range between VDD-VSS.

4. The rail-to-rail linear current mode charge pump as defined in claim 1, further comprising said first control signal and said second control signal being generated by a phase frequency detector.

5. The rail-to-rail linear current mode charge pump as defined in claim 1 further comprising said first switching device being coupled in series with said first current mirroring source device and said output voltage node, and said second switching device being coupled in series with said first current mirroring sink device and said output voltage node.

6. The rail-to-rail linear current mode charge pump as defined in claim 1 further comprising:
   said first current mirroring source device is a FET device having source (S), drain (D) and gate (G) terminals and said first switching device is a first voltage switch coupled to the gate (G) terminal of said first current mirroring source device and to said first source device, and
   said first current mirroring sink device is a FET device having source (S), drain (D) and gate (G) terminals and said second switching device is a second voltage switch coupled to the gate (G) terminal of said first current mirroring sink device and said first sink device.

7. The rail-to-rail linear current mode chare pump as defined in claim 4 further comprising said first control signal being an UP control signal and said second control signal being a DOWN control signal.

8. A method for providing a linear time-to-charge transformation in a rail-to-rail current mode charge pump comprising the steps of:
   providing an input source current $I_{REF}$;
   providing a first voltage rail VDD;
   providing a second voltage rail VSS;
   coupling a first current source device to the first voltage rail VDD;
   mirroring the current through the first current source device in a first current mirroring source device;
   sourcing current from the first current mirroring source device to an output voltage node in response to a first control signal;
   coupling a first current sink device to said second voltage rail VSS;
   mirroring the current through the first current sink device in a first current mirroring sink device;
   sinking current from the first current mirroring sink device and from the output voltage node in response to a second control signal;
   coupling the first current source device and the first current sink device in electrical series and forming a voltage node $V_{COMP}$ therebetween;
   coupling a rail-to-rail feedback network between the first current source device and the first current sink device for splitting the current $I_{REF}$ such that the current sourced to or sunk from the output voltage node is copied to the voltage node $V_{COMP}$ to cause the voltage at the voltage node $V_{COMP}$ to reach a steady state condition when the current flowing through the first current source and the first current sink devices is equal, whereby the charging or discharging of the voltage at the output voltage node is a function of the timing of the first switching and second switching control signals.

* * * * *

UNITED STATES PATENT AND TRADEMARK OFFICE
CERTIFICATE OF CORRECTION

PATENT NO.     : 6,677,789 B1
DATED          : January 13, 2004
INVENTOR(S)    : Mikael Svärd It is certified that error appears in the above-identified patent and that said Letters Patent is hereby corrected as shown below:

Title page,
Item [73], Assignee, "(NL)" should be -- (FI) --.
Item [57], ABSTRACT,
Line 11, "IREF" should be -- $I_{REF}$ --.

Signed and Sealed this

Twenty-ninth Day of June, 2004

JON W. DUDAS
*Acting Director of the United States Patent and Trademark Office*